(12) United States Patent
Everton

(10) Patent No.: US 8,742,846 B1
(45) Date of Patent: Jun. 3, 2014

(54) SELECTABLE GAIN DIFFERENTIAL AMPLIFIER

(71) Applicant: Hittite Microwave Corporation, Chelmsford, MA (US)

(72) Inventor: Seth L. Everton, Colorado Springs, CO (US)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/827,105

(22) Filed: Mar. 14, 2013

(51) Int. Cl.
  *H03F 3/45* (2006.01)
(52) U.S. Cl.
  USPC .......................................... 330/254; 330/258
(58) Field of Classification Search
  USPC .......................................... 330/254, 258, 261
  See application file for complete search history.

(56) References Cited

U.S. PATENT DOCUMENTS

| 4,462,003 | A |   | 7/1984  | Takamatsu |
|-----------|---|---|---------|-----------|
| 5,900,781 | A |   | 5/1999  | Igarashi et al. |
| 6,137,362 | A | * | 10/2000 | Dufossez ...................... 330/254 |
| 6,163,215 | A | * | 12/2000 | Shibata et al. ................ 330/254 |
| 6,703,899 | B2 |  | 3/2004  | Harberts |
| 7,482,879 | B2 | * | 1/2009  | Koutani et al. ............... 330/311 |
| 7,580,693 | B2 |  | 8/2009  | Rohde et al. |
| 2002/0021174 | A1 |  | 2/2002  | Robinson |

* cited by examiner

*Primary Examiner* — Henry Choe
(74) *Attorney, Agent, or Firm* — Iandiorio Teska & Coleman, LLP

(57) ABSTRACT

The selectable gain differential amplifier includes a differential amplifier, a plurality of cascade leg pairs connected to the differential amplifier, each leg of each cascode pair including a cascode device and a load resistor configured to provide a selectable gain. A variable voltage generator is connected to each leg configured to set gain resistor voltage of any active cascode leg pair to a uniform predetermined common mode voltage and the output node voltage of any inactive cascode leg pair to a voltage different from the predetermined common mode voltage. A selector circuit is configured to select the output of any said cascode leg pair.

10 Claims, 4 Drawing Sheets

US 8,742,846 B1

SELECTABLE GAIN DIFFERENTIAL AMPLIFIER

FIELD OF THE INVENTION

This invention relates to a selectable gain differential amplifier.

BACKGROUND OF THE INVENTION

Conventional variable gain amplifiers often rely on a differential amplifier, load resistors, and cascode switching transistors to produce variable gain output either in discrete steps (digital) or continuously variable (analog) as a function of a control signal. However, such a design results in different common mode (average) voltage level associated with the variable gain outputs. This may cause performance problems with other devices connected to the differential amplifier, e.g., downstream stages.

Many conventional variable gain amplifiers may rely on AC coupling (capacitors) to connect stages connected to the variable gain amplifier to allow the DC common mode voltages at different stages to be independent. However, series capacitors may limit the low frequency response of the amplifier. Additionally, capacitors can be quite large in size.

For example, U.S. Pat. No. 4,462,003, incorporated by reference herein, discloses a variable gain amplifier which employs a switched cascode design that utilizes different load resistor configurations to provide variable gain levels. U.S. Pat. No. 6,703,899, incorporated by reference herein, teaches a quad switched gain circuit that also utilizes a switched cascode approach to achieve different levels of gain. U.S. Pat. No. 5,900,781, incorporated by reference herein, discloses a multistage variable gain amplifier circuit that employs AC coupling capacitors between stages.

The Gilbert cell is a common cell used to vary the gain of an amplifier stage in analog or digital fashion while keeping a constant differential common-mode output voltage. The Gilbert cell includes a conventional differential amplifier common-emitter (for bipolar transistors) or common-source (for field effect transistors (FETs)) transistor pair with a cascode transistor pair attached to each output of the differential amplifier. The Gilbert cell relies on the cascode pairs to deliver or bleed current to the load resistors to create variable gain. Each leg of the Gilbert cell has two active cascode devices. Such a design results in an undesirably high level of output noise as the gain of the cell is varied.

SUMMARY OF THE INVENTION

In one aspect, the selectable gain differential amplifier is featured. The differential amplifier includes a plurality of cascode leg pairs coupled to the differential amplifier, each leg of each said cascode pair including a cascode device, an output node, and a load resistor configured to provide a selectable gain. A variable voltage generator is connected to each said leg configured to set the output node voltage of any active cascode leg pair to a uniform predetermined common mode voltage and the output node voltage of any inactive cascode leg pair to a voltage different from the predetermined common mode voltage. A selector circuit is configured to select the output of any said active cascode leg pair.

In one embodiment, the selector circuit may comprise a selector buffer circuit including a plurality of emitter follower pairs connected to output nodes of the cascode leg pairs. The selector buffer circuit may be configured to select the emitter follower pair connected to the active cascode leg pair to provide a buffered output voltage and the other emitter follower pairs are inactive based on the output node voltage of each said leg set by variable voltage generator. The selectable gain differential amplifier may include a common emitter or common source differential amplifier. The selectable gain differential amplifier may include a switching voltage generator connected to the control electrode of each said cascode leg pairs configured to turn on and turn off predetermined cascode leg pairs to provide the selectable gain. The plurality of cascode leg pairs may include three cascode leg pairs. The cascode common emitter differential amplifier may include a pair of emitter degenerative resistors. The ratio of the load resistor of each said leg to an associated degenerative resistor may be configured to determine the gain.

In another aspect, a method of providing selectable gain is featured. The method includes providing a differential amplifier, providing a plurality of cascode leg pairs connected to the differential amplifier, each leg of each said cascode pair including a cascode switching transistor and a load resistor, providing a selectable gain, providing a selector circuit, setting output node voltage of any active cascode leg pair to a uniform predetermined common mode voltage and the output node voltage of any inactive cascode leg pair to a voltage different from the predetermined current mode voltage, and selecting the output of any said active cascode leg pair.

In one embodiment, the method may include providing a selector buffer circuit including a plurality of emitter follower pairs connected to predetermined cascode legs of predetermined cascode leg pairs and selecting the emitter follower pair connected to any active cascode leg pair to provide a buffered output voltage and setting the other emitter follower pairs to be inactive based on output node voltage of each said leg.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
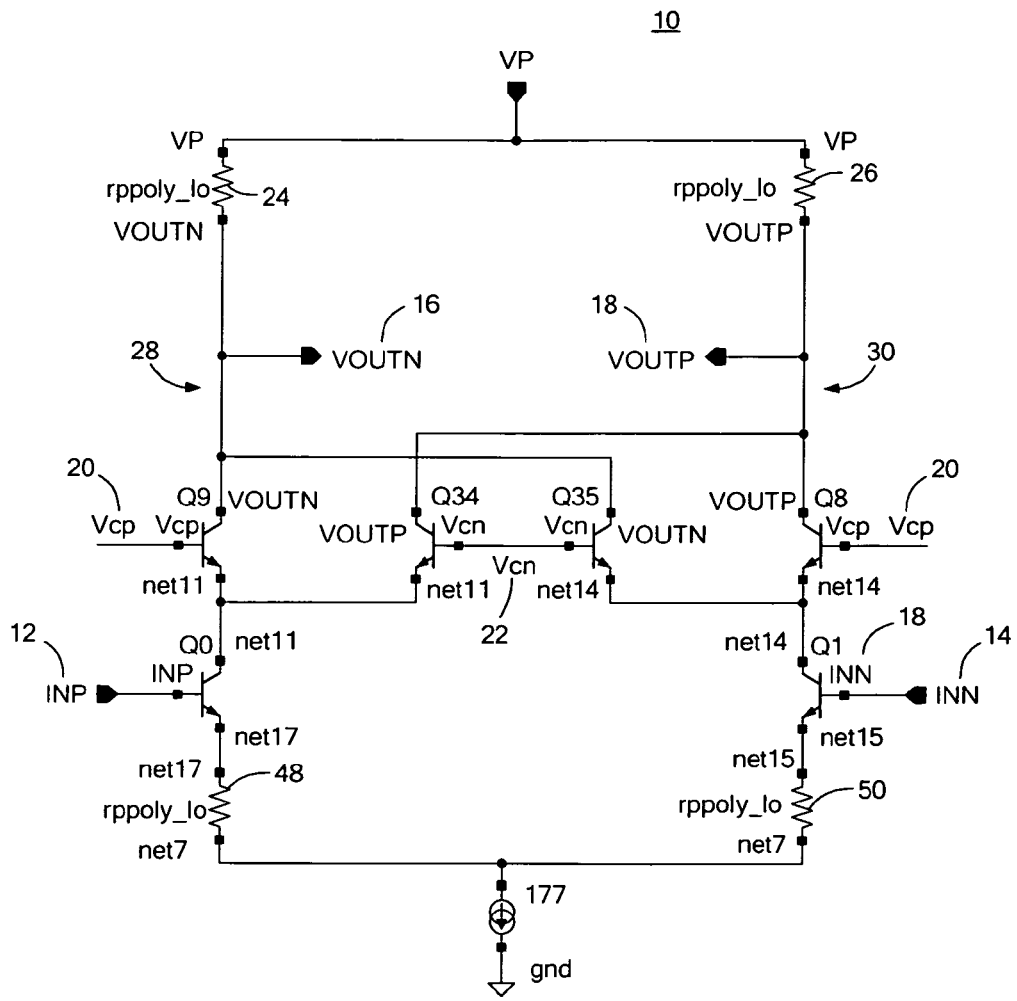
FIG. 1 is a schematic circuit diagram of a conventional Gilbert cell.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, conventional variable gain amplifiers often rely on a differential amplifier, load resistors, and cascode switching transistors to produce variable gain output which may result in different common mode voltages associated with the variable gain outputs. This may cause performance problems with other devices connected to the differential amplifier.

To introduce the concept of gain variability, Gilbert cell 10, FIG. 1, will now be discussed. Gilbert cell 10 is a common cell used to vary the gain of an amplifier stage. In operation, differential input signals are presented at INP-12 and INN-14. The output of Gilbert cell 10 is taken at VOUTP-14 and VOUTN-16. Gilbert cell 10 includes standard differential pair amplifier 18 with amplifier transistors Q0 and Q1 and may also include degeneration resistors 48 and 50 which reduce distortion introduced by Q0 and Q1 when large differential input swings are present and also help define the maximum gain of the Gilbert cell. Resistors 48 and 50 also degenerate (reduce) the differential output noise current generated by amplifier transistors Q0 and Q1. Cascade transistors (casecodes) Q9, Q34, and Q8, Q35 connected to Q0 and Q1, respectfully. Cascodes Q9, Q8, Q34, and Q35 are common base transistors which are configured to add the variable gain to Gilbert cell 10. Q9 and Q34 (or Q35 and Q8) can be viewed as differential pairs. They are controlled by Vcp-20 and Vcn-22, respectively, which are DC control voltages (no signal). When Vcp-20 is higher than Vcn-22, Q9 and QS will conduct most, or all, of the current (both DC current and signal current). When the levels Vcn-20 and Vcp-22 are selected such that part of the signal current is routed through Q34 and Q35, the gain is reduced. This is a result of part of the current being taken away from one load resistor and routed to the opposite load resistor, e.g., from load resistor 24 to load resistor 26.

For sake of simplicity, in this example, assume the right hand side of the Gilbert cell 10 is ignored. If Q34 becomes active, some of the current will be bled away from leg 28 causing a reduction in the voltage across load resistor 24 which reduces the gain of Gilbert cell 10.

It is possible to simply route the Q34 current to the rail or another voltage and ignore it, however, one of the interesting things that Gilbert cell 10 does is that it routes that current into other (complementary) leg 30. For differential amplifier 18, the signals on legs 28, 30 (p or n) are perfectly complementary, i.e., when one goes up, the other goes down by exactly the same amount. Therefore, the current that was bled off one leg is exactly the opposite signal of the other leg. In this example, the currents through Q34 are now reducing the signal currents produced by Q8 and the voltage produced by load resistor 26. The opposite effect occurs on the other half-circuit. One advantage this offers is that the common mode (average) voltage seen at output terminals VOUTN-16 and VOUTP-14 is constant for all gain settings. Another advantage is that the polarity of the output signal can be switched if desired (i.e. the gain of Gilbert cell 10 can vary from positive maximum through a value near zero to a negative maximum). However, a significant disadvantage of Gilbert cell 10 is that its differential output noise increases substantially as the gain is varied when degeneration is used in the differential amplifier pair. Even if no degeneration is used, output noise level will remain approximately constant with gain setting and as the output signal level decreases with lower gain setting. This leads to severe degradation of the output Signal to Noise Ratio (SNR) from the Gilbert Cell at the lower gain settings. It can be shown that when the Q34 device turns on and degeneration is used for the input differential pair, the noise at the output increases up to a maximum value when both Q34 and Q9 have the same current flowing through them (i.e. Vcp=Vcn corresponding to minimum gain setting of the Gilbert cell). This is an effect of having two active emitters, e.g., the emitters of Q9 and Q34 hanging on the common input nodes to the same nodes. The essence of the problem is that adding the second emitter drastically lowers the impedance seen by the emitter of the cascode device (Q9 or Q8). This changes the output noise characteristics of the cascode devices.

Figure 2:
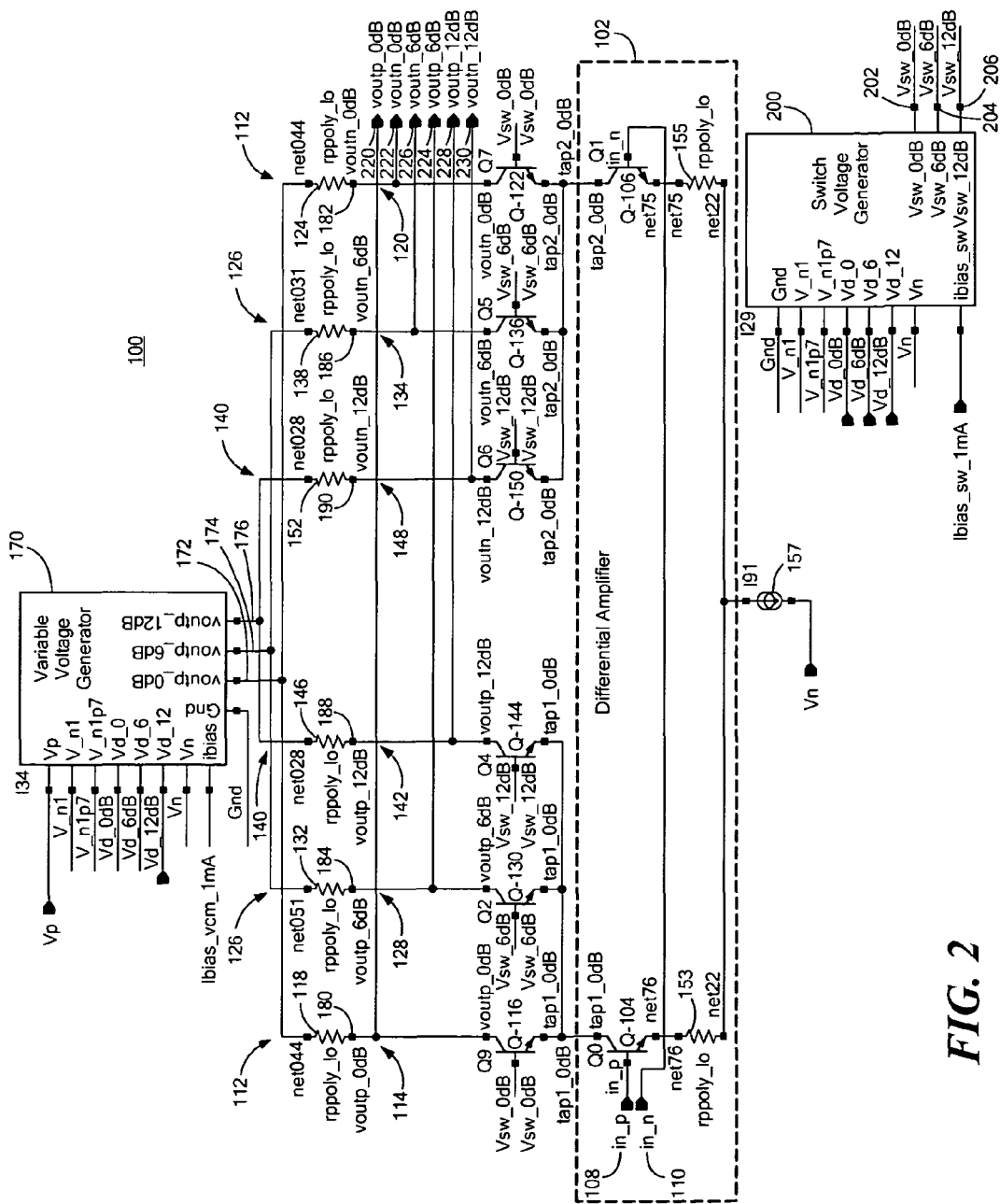
FIG. 2 is a schematic circuit diagram of one embodiment of the selectable gain differential amplifier of this invention.

Selectable gain differential amplifier 100, FIG. 2, of one embodiment of this invention includes differential amplifier 102 having at least two switching transistors Q-104 and Q-106 configured to receive differential input signal in_p-108, in_n-110. Selectable gain differential amplifier 100 also includes a plurality of cascade leg pairs connected to differential amplifier 102. Each leg of each cascode pair includes a cascode device and a load resistor configured to provide a selectable gain. In this example, cascode leg pair 112 includes cascode leg 114 with cascode device Q-116 and load resistor 118 and cascode leg 120 with cascode device Q-122 and load resistor 124. Similarly, cascode leg pair 126 includes casecode leg 128 with cascode device Q-130 and load resistor 132 and cascode leg 134 with cascode device Q-136 and load resistor 138. Cascade leg pair 140 includes cascode leg 142 with cascode device Q-144 and load resistor 146 and cascode leg 148 with cascode device Q-150 and load resistor 152.

In this example, selectable gain differential amplifier 100 includes three cascode leg pairs 112, 126, and 140, and will generate three distinct outputs, one for each of cascode leg pairs 112, 126 and 140. In other examples, selectable gain differential amplifier 100 may have only two cascode leg pairs, or more than three cascode leg pairs, as needed for a multitude of desired selectable gains. In this example, cascode pair 112 with cascode devises Q-116/Q-122 will provide distinct gain output at nodes 180, 182, e.g., voutp_0 dB. Cascode pair 126 with cascode devices Q-130/Q-136 will provide the distinct gain output at nodes 184, 186, e.g., voutp_6 dB. Cascade pair 140 with cascode devices Q-144/Q-150 will provide the distinct gain output at nodes 188, 190, e.g., voutp_12 dB. Thus, cascode devices Q-116/Q-122, Q-130/Q-136, and Q-144/Q-150 are used to accomplish the gain switching function of selectable gain differential amplifier 100. Only one of cascode leg pairs 112, 126, and 140 are active for a given gain setting. This is accomplished by switching voltage generator 200 (discussed in further detail below) connected to each of cascode leg pairs 112, 126, and 140. In this example, pin 202 of switching voltage generator 200 is connected to the control electrodes (bases) of devices Q-116 and Q-122 of cascode leg 112, pin 204 is connected to the bases of devices Q-130 and Q-136 of cascode leg 126, and pin 206 is connected to the bases of devices Q-144 and Q-150 of cascode leg 140. Switching voltage generator 200 is configured to produce voltages such that an "OFF" voltage drives a low base-emitter voltage to the "OFF" devices, thereby ensuring that they present minimal loading (maximum impedance) to the differential amplifier output. The "ON" voltage from switching voltage generator 200 applies a voltage level to the selected cascode pair such that the corresponding cascode devices have a large enough base-emitter voltage to operate in normal cascode fashion and carry the current from the differential amplifier to the output load resistor. For each of cascode leg pairs 112, 126, 140, there is a pair of load resistors, e.g. load resistors 118, 124 for cascode pair 112, load resistors 132, 138 for cascade pair 126 and load resistors 146, 152 for cascode pair 140. Each cascode leg pairs 112, 126, 140 corresponds to a different gain level. In one design, selectable gain differential amplifier 100 may include emitter degeneration resistors 153 and 155 to improve linearity, and tail current source 157. When selectable gain differential amplifier 100 includes emitter degeneration resistors 153 and 155, the gain of selectable gain differential amplifier 100 is preferably determined primarily by the ratio of the active load resistors to the emitter degeneration resistors. However, selectable gain differential amplifier 100 does not necessarily need to include emitter degeneration resistors 153 and 155. In that case, the gain is determined by the load resistors and other circuit properties.

Each of the gain settings of cascode pairs 112, 126, 140 requires a different load resistance. Hence the common mode voltage produced by each of cascode pairs 112, 126, 140 is different based simply on the IR drop across the load resistors, e.g., the common mode voltage at output nodes 180, 182 for cascode pair 112, the common mode voltage at output nodes 184, 186 for cascode pair 126, and common mode voltage at output nodes 188, 190 for cascode pair 140. As discussed in the Background section above, different common mode voltages may cause performance problems with other devices connected to selectable gain differential amplifier 100.

To correct the problems associated with different common mode voltages and provide a uniform common mode level for all the gain settings, selectable gain differential amplifier 100 includes variable voltage generator 170 connected to each of the cascode legs of each of the cascode leg pairs. In this example, variable voltage generator 170 is connected to each of cascode legs 114/120, 128/134, and 142/148 by lines 172, 174, 176, respectively, as shown. Variable voltage generator 170 is configured to set the output node voltage of each leg of the active cascode leg pair to a uniform common mode voltage, e.g., in this example, the common mode voltages at nodes 180, 182 when cascode leg pair 112 is active, the common mode voltages at nodes 184, 186 when cascode leg pair 126 is active, and the common mode voltages at nodes 188, 190 for cascode leg pair 140 is active. For all the inactive cascode leg pairs, variable voltage generator 170 provides a voltage level well below the desired output common voltage.

For example, when selectable gain differential amplifier 100 needs to output the gain associated with load resistors 118 and 124 indicated at nodes 180, 182, and shown at 220, 222, respectively, cascode leg pair 112 is active and cascode leg pairs 126 and 140 are not. Variable voltage generator 170 will then set the gain resistor voltage at node 180 for leg 114 and at node 182 for leg 120 to a uniform predetermined common mode voltage. When selectable gain differential amplifier 100 needs to output the gain associated with load resistors 132 and 138, indicated at nodes 184, 186 and shown at 224, 226, cascode leg pair 126 is active and cascode leg pairs 112 and 140 are not. Variable voltage generator 170 will then set the gain resistor voltage at node 184 for leg 128 and at node 186 for leg 134 to the same uniform predetermined common mode voltage. Similarly, when selectable gain differential amplifier 100 needs to output the gain associated with load resistors 146 and 152 at nodes 188, 190 shown at 228, 230, cascode leg pair 140 is active and cascode leg pairs 112 and 126 are not. Variable voltage generator 170 will then set the gain resistor voltage at node 188 for leg 142 and at node 190 for leg 148 to the same uniform predetermined common made voltage. Given that only one pair of the cascode pairs 112, 126, and 140 is active at a time, there is no significant noise degradation with respect to that of a differential cascode common emitter amplifier and the output signal to noise ratio can remain relatively constant with different gain setting.

Figure 3:
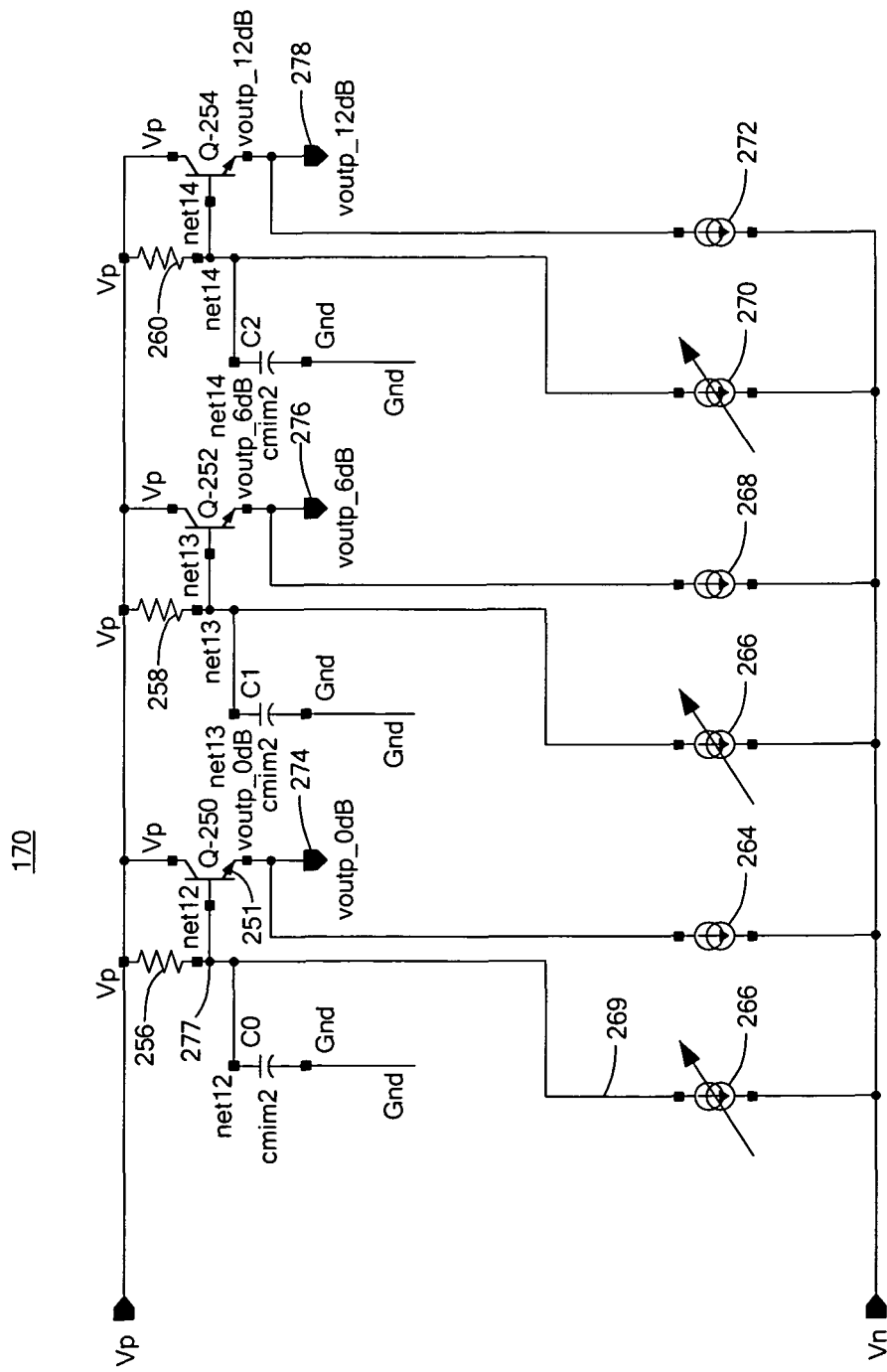
FIG. 3 is a schematic circuit diagram showing in further detail one exemplary embodiment of the variable voltage generator shown in FIG. 2.

FIG. 3 shows one exemplary embodiment of variable voltage generator 170. In this example, variable voltage generator 170 includes diode drop transistor Q-250, Q-252, and Q-254, and voltage drop resistors 256, 258, and 260, associated with Q-250, Q-252, and Q-254, respectively. In this example, variable voltage generator 170 also includes current sources 262, 264, 266, 268, 270, and 272. Nodes 274, 276, and 278 are coupled to lines 172, 174, 176, FIG. 2, respectively.

In operation, variable voltage generator 170, FIG. 3, provides three output voltages at nodes 274, 276, and 278, e.g., voutp_0 dB, voutp_6 dB and voutp_12 dB, respectively, which correspond to voltages on lines 172, 174 and 176, respectively, FIG. 2. There are two voltages that each of nodes 274, 276, and 278 can have. One is the "ON" voltage and the other is "OFF" voltage. The output voltages at nodes 274, 276, and 278 are generated by the ON or OFF voltages of the node. For example, switched current source 262 pulls current through resistor 256 creating an IR voltage drop at node 277. In this example, Q-250 is always "ON" so there is a diode voltage drop from node 277 to node 274 (voutp_0 dB). For the purpose of this example, the diode drop across the Vbe of Q-250 is ignored. Emitter 251 of Q-250 at node 274 provides a low impedance looking into the device making it look like a voltage source. When current switch 266 changes the current on line 269, this changes the voltage across resistor 256 and the voltage at nodes 274 and 277. The diode drop across Q-250 stays constant. The combination of Q-252/resistor 258 and Q-254/resistor 260 function similarly. The voltages at nodes 274, 276, and 278 allow for normal active operation of corresponding cascode leg pairs 112, 126, 140, FIG. 2, respectively or deactivate cascode leg pairs 112, 126, 140. Current sources 264, 268, and 272, FIG. 3, are bleeder current sources that force Q-250, Q252 and Q254 to stay "ON".

Figure 4:
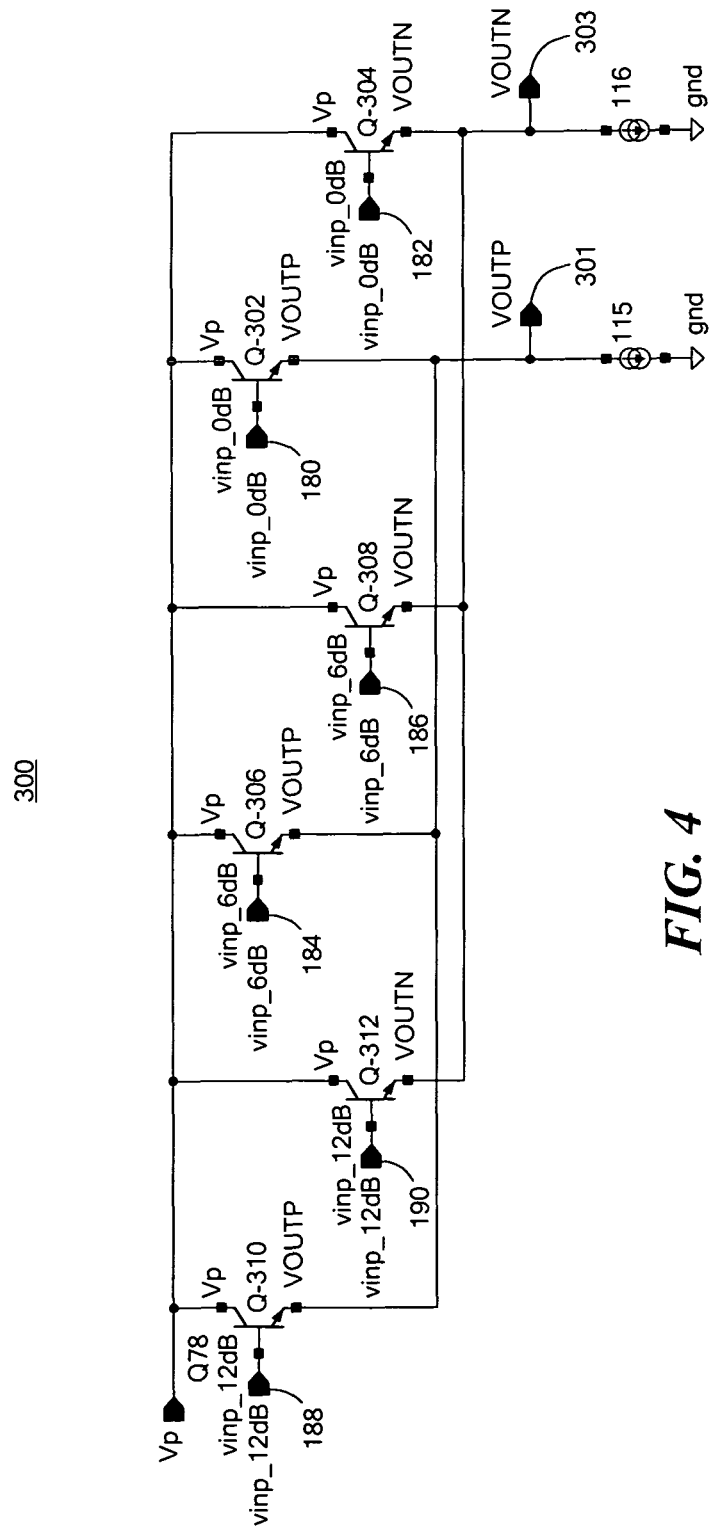
FIG. 4 is a schematic circuit diagram of a selector buffer circuit of one embodiment of this invention connected to the selectable gain differential amplifier shown in FIG. 1.

Selectable gain differential amplifier 100, FIG. 2, also preferably includes a selector circuit connected thereto which is configured to select the output of any active cascode leg pairs 112, 126, and 140. In one example, the selector circuit may be configured as selected buffer circuit 300, FIG. 4. In this example, selector buffer circuit 300 includes a plurality of emitter follower pairs connected to predetermined cascode legs of cascode leg pairs configured such that the emitter follower pair connected to the active cascode leg pair provides a buffered output voltage at nodes VOUTP-301 and VOUTN-303 and the emitter followers connected to the other cascode leg pairs are inactive based on the voltage levels set by variable voltage generator 170. In this example, selector buffer circuit 300 includes emitter follower pair Q-302/Q-304 connected to nodes 180, 182, FIG. 2, of legs 114, 120, FIG. 2, respectively of cascode leg pair 112. Similarly, emitter follower pairs Q-306/Q-308, FIG. 4, are connected to nodes 184, 186, FIG. 2, of legs 128, 134 of cascode leg pair 126, respectively. Emitter follower pairs Q-310/Q-312, FIG. 4, are connected to nodes 188, 190, FIG. 2, of legs 142, 148 of cascode leg pair 140, respectively. As discussed above, only one of cascode leg pairs 112, 126, or 140 are active at any given time for a desired gain setting. Thus, in this example, emitter follower pairs Q-302/Q-304 will be turned on when cascode pair 112 is active to provide the output buffer voltage at nodes VOUTP-301 and VOUTN-303 and emitter follower pairs Q-306/Q-308 and Q-310/Q-312 will be inactive based on the voltage levels at nodes 180-190 set by variable voltage generator 170. Similarly, emitter follower pairs Q-306/Q-308 will be turned on when cascode pair 126 is active to provide the output buffer voltage at nodes VOUTP-301 and VOUTN-303 and emitter follower pairs Q-302|Q-304 and Q-310/Q-312 will be turned off based on the voltage levels at nodes 180-190 set by variable voltage generator 170. Likewise, emitter follower pairs Q-310/Q-312 will be turned on when cascode pair 140 is active to provide the output buffer voltage at nodes VOUTP-301 and VOUTN-303 and emitter follower pairs Q-302/Q-304 and Q-306/Q-308 will inactive based on the voltage levels at nodes 180-190 set by variable voltage generator 170. Thus, selector circuit provides the ability to select only the active cascode leg pair output voltage and generates an output voltage at the output nodes VOUTP-301, VOUTN-303.

The result is selectable gain differential amplifier 100 provides a uniform predetermined common mode voltage for any active cascode leg pair without the need for AC coupling or capacitors connected to the output as found in conventional variable gain amplifiers. Selectable gain differential amplifier 100 also provides low noise and high linearity.

Although specific features of the invention are shown in some drawings and not in others, this is for convenience only as each feature may be combined with any or all of the other features in accordance with the invention. References to "active devices" or "transistors" may include Bipolar Junction Transistors (BJT), Field Effect Transistors (FET), or other three (or more)-terminal active devices. Also, one or more of these devices may have opposite polarities from the ones described (e.g. P-type transistors may be used instead of N-type transistors) The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended. Other embodiments will occur to those skilled in the art and are within the following claims.

What is claimed is:

1. A selectable gain differential amplifier comprising:
    a differential amplifier;
    a plurality of cascode leg pairs coupled to the differential amplifier, each leg of each said cascode pair including a cascode device, an output node, and a load resistor configured to provide a selectable gain;
    a variable voltage generator connected to each said leg configured to set the output node voltage of any active cascode leg pair to a uniform predetermined common mode voltage and the output node voltage of any inactive cascode leg pair to a voltage different from the predetermined common mode voltage; and
    a selector circuit configured to select the output of any said active cascode leg pair.

2. The selectable gain differential amplifier of claim 1 in which the selector circuit comprises as a selector buffer circuit including a plurality of emitter follower pairs connected to output nodes of the cascode leg pairs, the selector buffer circuit configured to select the emitter follower pair connected to the active cascode leg pair to provide a buffered output voltage and the other emitter follower pairs are inactive based on the output node voltage of each said leg set by variable voltage generator.

3. The selectable gain differential amplifier of claim 1 in which the selectable gain differential amplifier includes a common emitter or common source differential amplifier.

4. The selectable gain differential amplifier of claim 1 further including a switching voltage generator connected to the control electrode of each said cascode leg pairs configured to turn on and turn off predetermined cascode leg pairs to provide the selectable gain.

5. The selectable gain differential amplifier of claim 1 in which the plurality of cascode leg pairs includes three cascode leg pairs.

6. The selectable gain differential amplifier of claim 3 in which the cascode common emitter differential amplifier includes a pair of emitter degenerative resistors.

7. The selectable gain differential amplifier of claim 6 in which the ratio of the load resistor of each said leg to an associated degenerative resistor is configured to determine the gain.

8. A method of providing selectable gain, the method comprising:
    providing a differential amplifier;
    providing a plurality of cascode leg pairs connected to the differential amplifier, each leg of each said cascode pair including a cascode switching transistor and a load resistor;
    providing a selectable gain;
    providing a selector circuit;
    setting output node voltage of any active cascode leg pair to a uniform predetermined common mode voltage and the output node voltage of any inactive cascode leg pair to a voltage different from the predetermined current mode voltage; and
    selecting the output of any said active cascode leg pair.

9. The method of claim 8 further providing a selector buffer circuit including a plurality of emitter follower pairs connected to predetermined cascode legs of predetermined cascode leg pairs.

10. The method of claim 9 further including selecting the emitter follower pair connected to any active cascode leg pair to provide a buffered output voltage and setting the other emitter follower pairs to be inactive based on output node voltage of each said leg.

* * * * *